(12) United States Patent
Hassner et al.

(10) Patent No.: US 7,475,329 B2
(45) Date of Patent: Jan. 6, 2009

(54) TECHNIQUES FOR PERFORMING GALOIS FIELD LOGARITHMS FOR DETECTING ERROR LOCATIONS THAT REQUIRE LESS STORAGE SPACE

(75) Inventors: Martin Hassner, Mountain View, CA (US); Christopher Dudley, Oronoco, MN (US)

(73) Assignee: Hitachi Global Storage Technologies Netherlands B.V., AZ Amsterdam (NL)

( * ) Notice: Subject to any disclaimer, the term of this patent is extended or adjusted under 35 U.S.C. 154(b) by 589 days.

(21) Appl. No.: 11/059,734

(22) Filed: Feb. 16, 2005

(65) Prior Publication Data

US 2006/0195769 A1    Aug. 31, 2006

(51) Int. Cl.
  *H03M 13/00* (2006.01)
(52) U.S. Cl. ...................................... 714/785
(58) Field of Classification Search ................. 714/785
  See application file for complete search history.

(56) References Cited

U.S. PATENT DOCUMENTS

| | | | | |
|---|---|---|---|---|
| 4,142,174 A | * | 2/1979 | Chen et al. | 714/784 |
| 4,162,480 A | * | 7/1979 | Berlekamp | 714/784 |
| 5,467,297 A | * | 11/1995 | Zook | 708/492 |
| 5,502,665 A | | 3/1996 | Im | |
| 5,771,184 A | * | 6/1998 | Lan et al. | 708/492 |
| 5,812,438 A | | 9/1998 | Lan et al. | |
| 5,831,878 A | * | 11/1998 | Ishida | 708/277 |
| 6,098,193 A | * | 8/2000 | Itoi | 714/795 |
| 6,141,786 A | * | 10/2000 | Cox et al. | 714/763 |
| 6,343,305 B1 | | 1/2002 | Koc et al. | |
| 6,378,104 B1 | * | 4/2002 | Okita | 714/784 |
| 6,701,336 B1 | * | 3/2004 | Shen et al. | 708/492 |
| 7,089,276 B2 | * | 8/2006 | Miller et al. | 708/492 |
| 2004/0078408 A1 | | 4/2004 | Miller et al. | |

OTHER PUBLICATIONS

Stephen B. Wicker, Error Control Systems for Digital Communication and Storage, 1995 Prentic Hall.*

* cited by examiner

*Primary Examiner*—Jacques Louis-Jacques
*Assistant Examiner*—Sam Rizk
(74) *Attorney, Agent, or Firm*—Townsend and Townsend and Crew LLP; Rambod Nader

(57) ABSTRACT

To perform error detection and correction on a data sector, syndromes are calculated and used to determine error values and error locations. Logarithmic calculations in Galois field need to be performed to determine the error locations using the syndromes. Finite field vectors are represented as "complex" numbers of the form $Az+B$. An algorithm is performed using the field vectors represented as complex numbers to generate the error locations. The algorithm requires the use of logarithm calculations. The results of the logarithmic calculations are looked up in two (or more) log tables. The log tables store all the possible results of the logarithm calculations. The log tables store significantly less bits than prior art techniques, reducing the amount of storage space required by a factor of 171. Techniques for controlling accesses to the log tables in an efficient manner are also provided.

5 Claims, 5 Drawing Sheets

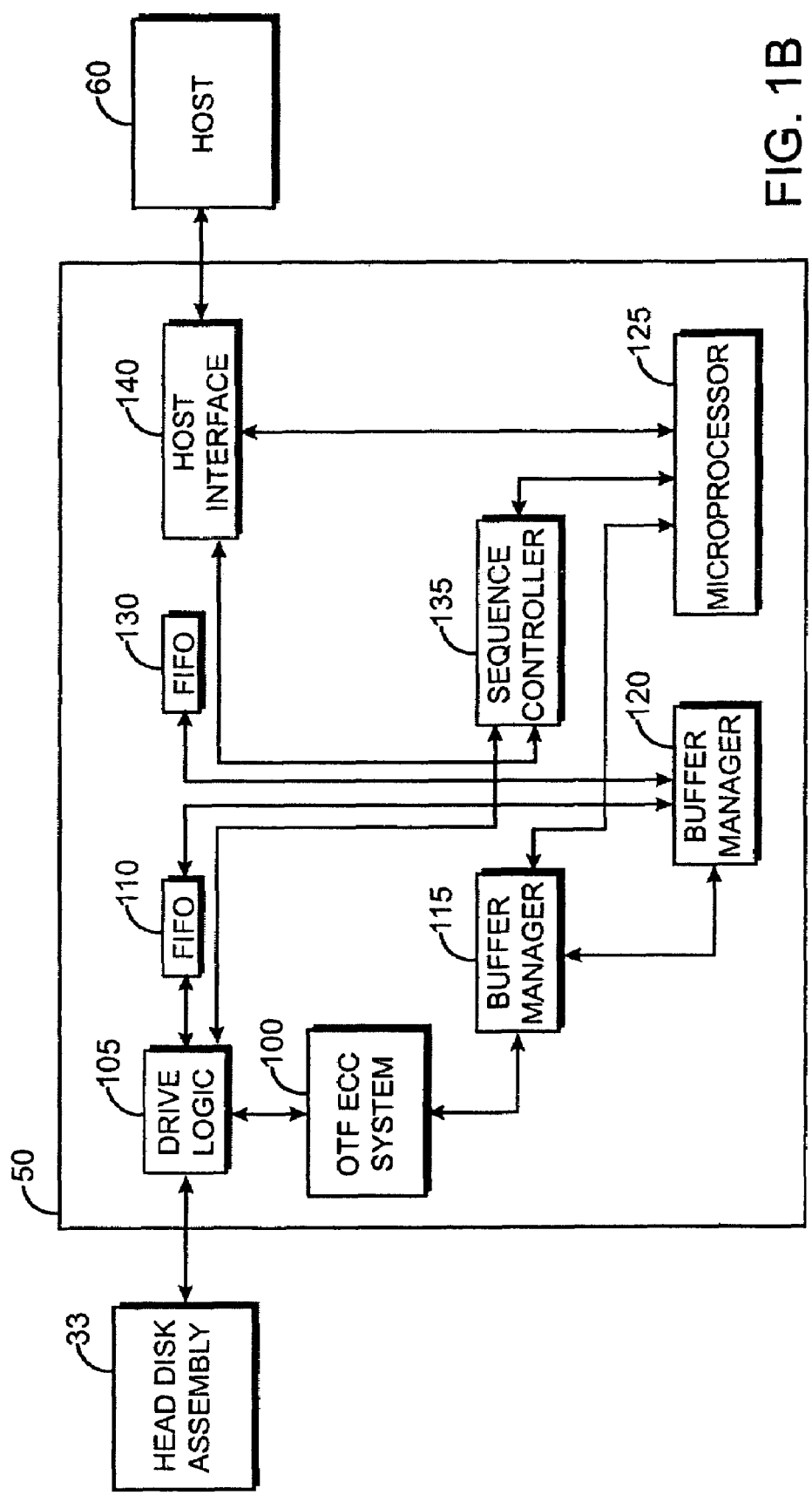

$$M = \begin{array}{|l|} \hline 0011101000011101 \\ 0001110110000000 \\ 1000000001000000 \\ 0100000000100000 \\ 0010000000010000 \\ 0001000000001000 \\ 0000100000000100 \\ 0000010000000010 \\ 1000000000000000 \\ 0100000000000000 \\ 0010000000000000 \\ 0001000000000000 \\ 0000100000000000 \\ 0000010000000000 \\ 0000001000000000 \\ 0000000100000000 \\ \hline \end{array}$$

TECHNIQUES FOR PERFORMING GALOIS FIELD LOGARITHMS FOR DETECTING ERROR LOCATIONS THAT REQUIRE LESS STORAGE SPACE

BACKGROUND OF THE INVENTION

The present invention relates to more efficient techniques for performing calculations for determining error locations, and more particularly, to techniques for determining error locations in data by performing Galois field logarithm calculations that require less storage space.

Arithmetic operations performed in Galois field are important in numerous applications. A Galois field $GF(2^m)$ is a set that contains a finite number of elements, where m is a positive integer. The elements of a Galois field can be represented in many ways.

One application involves using Galois field arithmetic to determine the location of errors in digital data. One such example are Reed-Solomon codes that are used in hard disk drives, compact disk players, communications systems, and in other applications. Most of these applications require fast methods or simple integrated circuits that perform operations such as multiplication, squaring, addition, and exponentiation.

The calculation of 16-bit finite fields is required to determine the location of errors in digital data using Reed-Solomon error correction encoding techniques. This operation involves a 16-bit finite logarithm calculation using Galois field arithmetic. The operation can be performed using circuitry or software by storing all possible output values of the 16-bit logarithm in a lookup table. The table for the 16-bit logarithm has $16(2^{16}-1)=1,048,560$ values. An implementation of a table of this size requires about one million logic gates.

Therefore, it would be desirable to provide techniques for reducing the amount of bits stored in tables that represent a 16-bit finite Galois field logarithm calculation.

BRIEF SUMMARY OF THE INVENTION

To perform error detection and correction on a data sector, syndromes are calculated and used to determine error values and error locations. Logarithmic calculations in Galois field need to be performed to determine the error locations using the syndromes. According to the present invention, finite field vectors are represented as "complex" numbers of the form Az+B. An algorithm is performed using the field vectors represented as complex numbers to generate the error locations.

The algorithm requires the use of logarithm calculations. The results of the logarithmic calculations are looked up in two (or more) log tables. The log tables store all the possible results of the logarithm calculations. According to the present invention, the log tables store significantly less bits than prior art techniques, saving a substantial amount of storage space. The present invention also provides techniques for controlling accesses to the log tables in an efficient manner.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 1B is a block diagram of a data storage system depicting data flow along a read channel and a write channel of the hard disk drive controller of FIG. 1A.

FIG. 3 illustrates a matrix for calculating check sums according to an embodiment of the present invention.

FIG. 4A illustrates an example of an 8-bit log table according to an embodiment of the present invention.

FIG. 4B illustrates an example of a 16-bit log table according to an embodiment of the present invention.

DETAILED DESCRIPTION OF THE INVENTION

Figure 1A:
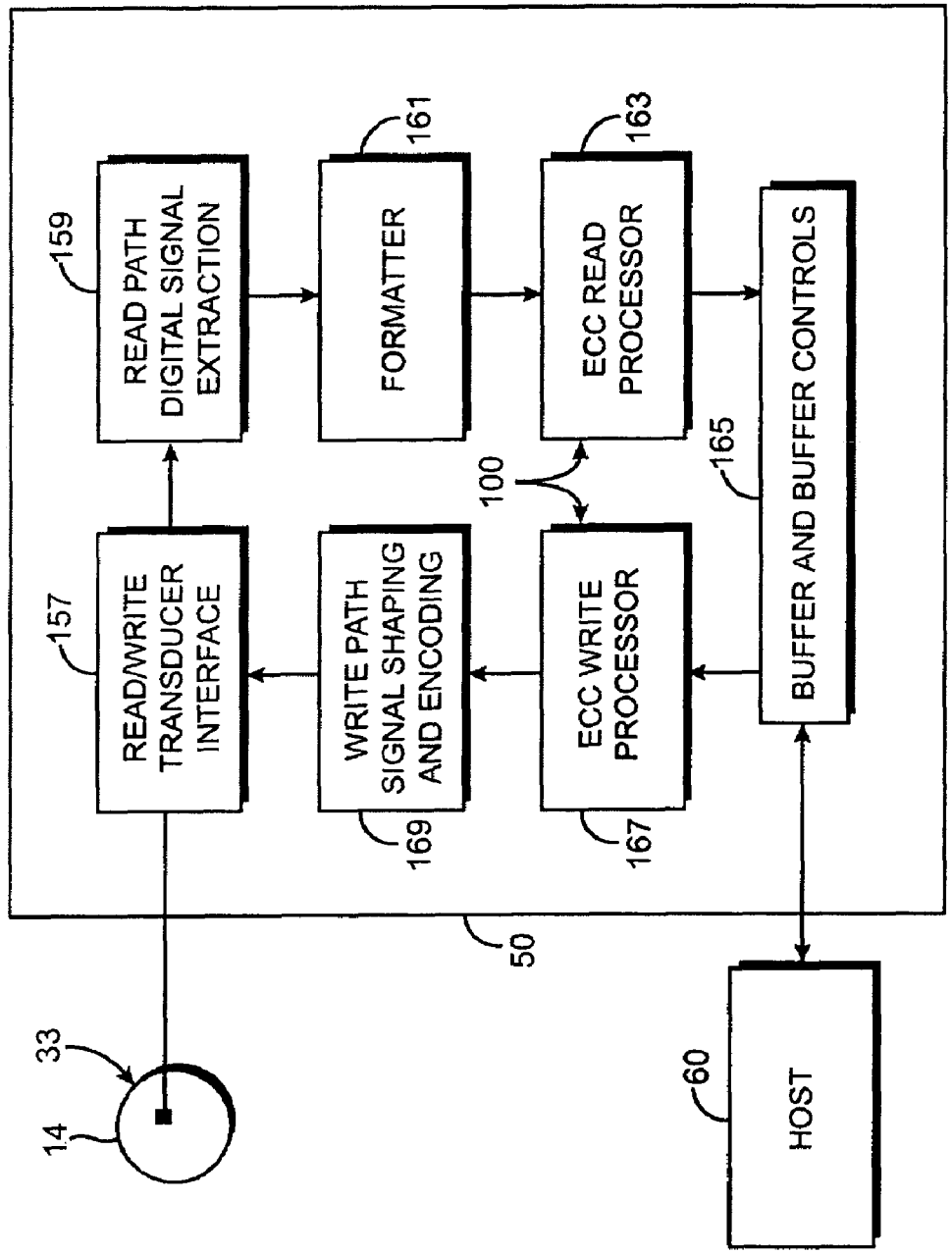
FIG. 1A is a block diagram detailing the architecture of a buffered hard disk drive controller that includes an on-the-fly error correction code (ECC) system for implementing on-the-fly error correction code.

FIGS. 1A and 1B illustrate an example of a hard disk drive control system for reading and writing data onto a magnetic hard disk. The hard disk drive control system of FIGS. 1A-1B is an example of hard disk drive system that can implement techniques of the present invention. The hard disk drive system shown in FIGS. 1A-1B can detect and correct errors in the data read from a disk.

FIG. 1A illustrates an exemplary architecture of a buffered hard disk drive controller 50. Hard disk drive controller 50 is configured to read data from and write data to a magnetic hard disk 14. Controller 50 includes an on-the-fly error correction code (ECC) system 100 for implementing an on-the-fly error correction code. On-the-fly error correction code system 100 includes an ECC read processor 163 and an ECC write processor 167.

FIG. 1B is a block diagram of the hard disk drive controller 50 of FIG. 1A that includes an on-the-fly error correction code system 100. When sequences of digital binary data are to be written onto the disk 14, they are placed temporarily in a buffer 165 shown in FIG. 1A and subsequently processed and transduced along a write path or channel (167, 169, and 157).

The hard disk drive controller 50 includes a logic drive circuit 105 shown in FIG. 1B that formats data from hard disk assembly 33, for example from 8 bits to 32 bits. A disk assembly 33 is comprised of disk 14 and a head stack assembly including a spindle motor. A FIFO register 110 stores the formatted data and exchanges the same with a sector buffer 120. The ECC system 100 receives the formatted data from the drive logic circuit 105 and performs an error correction coding algorithm. ECC system 100 can also perform the techniques and processes of the present invention, which are discussed in detail below.

A buffer manager 115 controls data traffic between the ECC system 100, a sector buffer (i.e., random access memory) 120, and a microprocessor 125. Another FIFO register 130 stores data and exchanges the same with the sector buffer 120. A sequence controller 135 is connected between the drive logic circuit 105, the microprocessor 125, and a host interface 140, to control the sequence operation of the data traffic and various commands across the hard drive controller 50. The host interface 140 provides an interface between the hard drive controller 50 and a host 60.

First, a predetermined number of binary data elements, also termed bytes, in a data string are moved from the buffer 165 and streamed through an ECC write processor 167. In the ECC write processor 167, the data bytes are mapped into codewords drawn from a suitable linear block or cyclic code such as a Reed-Solomon code. Next, each codeword is mapped in a write path signal-shaping unit 169 into a run length limited or other bandpass or spectral-shaping code and changed into a time-varying signal. The time-varying signal is applied through an interface read/write transducer interface 157 and then to the write element in a magneto resistive (or other suitable transducer head) for conversion into magnetic flux patterns.

All of the measures starting from the movement of the binary data elements from buffer 165 until the magnetic flux patterns are written on a selected disk track as the rotating disk 14 passes under the read/write head are synchronous and streamed. For purposes of efficient data transfer, the data is de-staged (written out) or staged (read) a codeword at a time.

Thus, both the mapping of binary data into Reed-Solomon codewords and the conversion to flux producing time-varying signals must be done well within the time interval defining a unit of recording track length moving under the transducer. Typical units of recording track length are equal fixed-length byte codewords of 512 bytes.

When sequences of magnetic flux patterns are to be read from the disk 14, they are processed in a read path or channel (157, 159, 161, and 163) and written into the buffer 165. The time-varying signals sensed by a transducer are passed through the read/write transducer interface 157 to a digital signal extraction unit 159. Here, the signal is detected and a decision is made as to whether it should be resolved as a binary 1 or 0. As these 1's and 0's stream out of the signal extraction unit 159, they are arranged into codewords in the formatting unit 161.

Because the read path is evaluating sequences of Reed-Solomon codewords previously recorded on the disk 14, absent error or erasure, the codewords should be the same. In order to test whether that is the case, each codeword is applied to an ECC read processor 163 over a path from a formatter 161.

Also, the output from the ECC processor 163 is written into buffer 165. The read path also operates in a synchronous data-streaming manner such that any detected errors must be located and corrected within the codeword well in time for the ECC read processor 163 to receive the next codeword read from the disk track. The buffer 165 and the read and write channels may be monitored and controlled by the microprocessor 125 to ensure efficacy where patterns of referencing may dictate that a path not be taken down, such as sequential read referencing.

Figure 2:
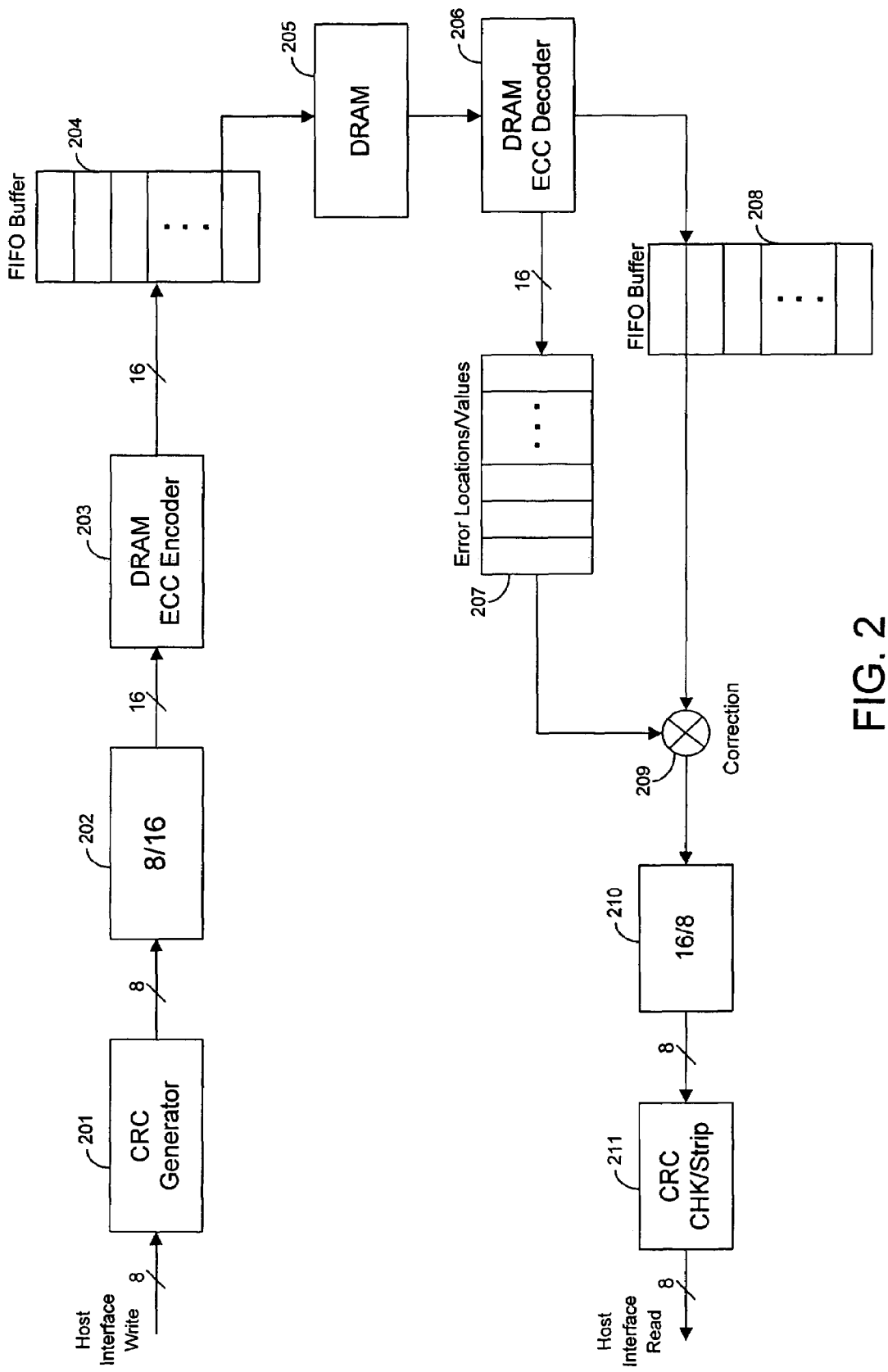
FIG. 2 illustrates an error correction system that corrects errors in digital data using the techniques of the present invention.

FIG. 2 illustrates further details of error correction functions that are performed by hard disk driver controller 50. A cyclic redundancy check (CRC) generator 201 receives 8 data bytes from the host interface during a write cycle and generates 4 CRC bytes that are padded to an 8 byte output value. Block 202 receives 8 bytes and outputs 16 bytes. DRAM ECC encoder 203 receives the 16 bytes from block 202 and generates 16-bit ECC codes that are inserted into the data stream. The ECC codes are used for locating and correcting hard errors generated when the data is stored in DRAM.

The 16 bytes output by encoder 203 are stored first in a first-in-first-out (FIFO) buffer 204, and then, in DRAM 205. DRAM 205 may contain, for example, 64 MBytes of storage. The data is subsequently read out of DRAM 205 and processed by DRAM ECC decoder block 206. Decoder 206 decodes the ECC codes to generate syndromes and uses the syndromes to generate error locations and error values, which are stored in register 207. The data is transmitted to FIFO 208 for storage.

Correction block 209 performs the error correction functions according to well known error correction techniques (e.g., Reed-Solomon error correction techniques). Block 210 converts the error corrected 16 bytes generated by correction block 209 into 8 bytes. These 8 bytes are further processed by CRC CHK/Strip block 211 before being transmitted to the host interface during a read cycle.

As discussed above, Galois field arithmetic is performed by disk drive controllers of the present invention to calculate the location of errors in digital data using syndromes. The present invention provides techniques for performing Galois field logarithmic calculations that require significantly less bits stored in log tables than many prior art techniques. Embodiments of the present invention will now be discussed in detail.

Galois field arithmetic has two functions in error correction encoding and decoding. The first function is to represent the data as symbols. The second function is to represent the location of a symbol in a block of symbols. To determine the location of an error, the exponent of number $a^L$ is calculated, where "a" is the Galois field generator.

Error correction systems of the present invention represent a bit string as a polynomial having powers of a number "a" in Galois field. As a specific example, GF(16) is expressed by powers of the root "a" of the polynomial $a^4+a+1=0$.

A Galois field used in an 8-bit system has $2^8$ elements ($2^8=256$) and is denoted by GF(256). A Galois field can be defined by a primitive polynomial generating the Galois field. There are 16 primitive polynomials that can generate GF(256), and there are 128 ways to construct a $GF(2^{16})$ from a Galois field ($2^8$) using quadratic irreducible polynomials.

If 8 symbols of 16 bits each (128 bits total) or 4 symbols of 16 bits each (64 bits total) are encoded in parallel, two check sums ($R_0$, $R_1$) are calculated to perform error correction on these symbols. One of the check sums is weighted, i.e., each of the symbols is multiplied by a fixed number before summing. Thus, for the 128-bit parallel encoder, 8 fixed distinct multipliers are needed. For the 64-bit parallel encoder, 4 fixed distinct multipliers are needed.

Figures 3, 4A, 4B:
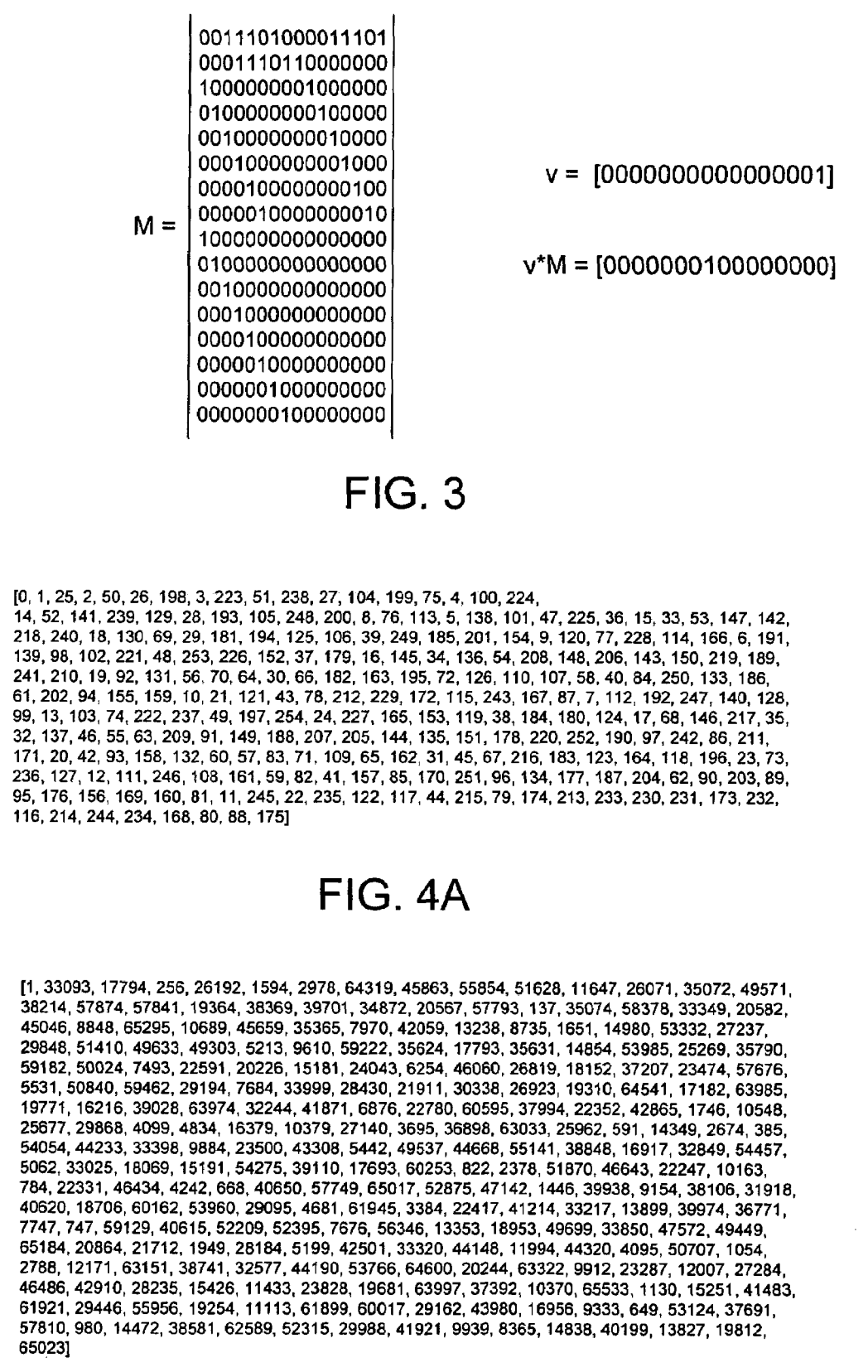

Assume a data stream is represented by the string [$m_1$, $m_2$, $m_3$, $M_4$ ... $m_{16}$] of 16 symbols, where each symbols $m_k$, k=1 ... 16 is a 16-bit vector. The two check sums ($R_0$, $R_1$) can be calculated by multiplying the 16-bit vectors with 16-by-16 matrices, where the arithmetic is modulo 2. An example of a matrix M that can be used for this calculation is shown in FIG. 3. This matrix M is the generator of the 16-bit finite field. This generator is the matrix representation of a root "z" of a polynomial whose powers [$z^k$], k=1 ... $2^{16}-1$, are all distinct and correspond to the distinct 16-bit patterns. The matrix shown in FIG. 3 is used to multiply by "z," where "v" is the unit vector, and v×M is the resulting vector that corresponds to z.

The two check sums $R_0$ and $R_1$ are calculated using equations (1) and (2) below, where k is the length of the data sequence, and each $m_i$ is a 16-bit string.

$$R_0 := R_0 + \sum_{k=1}^{8} m_{i+k} \qquad (1)$$

$$R_1 := R_1 + \sum_{k=1}^{8} z^{8-k} \times m_{i+k} \qquad (2)$$

When the data is read, the same computation on the data symbols results in two syndromes $[S_0, S_1]$. To calculate the syndromes $[S_0, S_1]$, the same computation is performed on the data part of the read block, where $S_0=R_0-R_0'$, $S_1=R_1-R_1'$, is the modulo 2 sum of the written and recalculated check sums. The matrix M shown in FIG. 3 and two 16-bit registers $[R_0, R_1]$ are used to perform this calculation, where the value of $R_1$ after each 8 symbol chunk is multiplied by the matrix and added to the $R_1$ contributions of the next 8 symbol chunk.

$S_0$ is the error value (provided it is non-zero), and $\log(S_1/S_0)$ is the error location. In order to implement this logarithm function, a $(2^{16}-1)$-by-16 table requiring 1,048,560 bits of storage is needed. This large amount of storage is very difficult to implement in a hard drive controller.

Therefore, the present invention provides techniques for reducing the amount of data that needs to be stored in a table used to implement $\log(S_1/S_0)$. According to the present invention, a finite field of 8-bit symbols $GF(2^8)$ is extended to the finite field $GF(2^{16})$ of 16-bit symbols, such that each 16-bit symbol is viewed as a "complex" number.

$GF(2^8)$ is used as a quadratic extension of $GF(2^{16})$ to implement 16-bit finite Galois field logarithm functions. The "complex" number representation is in the form $S=Az+B$, where A and B are 8-bit symbols, and A, $B \in GF(2^8)$. Thus, $S_1/S_0$ is a number of this type, where $Az+B=A(z+B/A)$, and $\log(S_1/S_0)=[\log(A)+\log(z+B/A)] \bmod (2^{16}-1)$.

Instead of needing to store a table of over a million bits, only one table of 255-by-16 (4080 bits) and a table of 255-by-8 (2040 bits) need to be stored to calculate $\log(B/A)$, according to one embodiment of the present invention. This represents a total of 6120 bits of storage to calculate the logarithm function used for determining the error location, resulting in a reduction in storage space by a factor of 171.

Details of this embodiment of the present invention are now discussed. As described above, an error correction computation on the data symbols results in two syndromes $[S_0, S_1]$. $S_0$ is the error value (provided it is non-zero), and $\log(S_1/S_0)=\log S_1-\log S_0$ is the error location, where both $S_0$ and $S_1$ are 16-bit vectors. The 16-bit finite field vectors are represented as "complex" numbers of the form $Az+B$, where A and B are 8-bit vectors each, according to the present invention.

The algorithm is performed as follows. Given $S_0=A_0z+B_0=A_0(z+C_0)$ and $S_1=A_1z+B_1=A_1(z+C_1)$, four 8-bit numbers $[iA_0, iB_0, iA_1, iB_1]$ are calculated. These 4 numbers are the numerical indices of these 8-bit vectors in the basis $[2^7, 2^6, 2^5, 2^4, 2^3, 2^2, 2^1, 2^0]$. The 8-bit log table takes as an input a numerical index "i" and produces as an output an 8-bit vector which is the corresponding logarithm. Using the four 8-bit numbers $[iA_0, iB_0, iA_1, iB_1]$ as inputs to the log table, the log table generates 8-bit outputs $[\log_8 A_0, \log_8 B_0, \log_8 A_1, \log_8 B_1]$.

Next, the following calculations are performed, $\log_8 C_0=(\log_8 B_0-\log_8 A_0) \bmod 255$, and $\log_8 C_1=(\log_8 B_1-\log_8 A_1) \bmod 255$. The 8-bit numbers $[\log_8 C_0, \log_8 C_1]$ generated in these calculations are now used as input to the 16-bit log table to obtain two 16-bit output numbers $[\log_{16} C_0, \log_{16} C_1]$. These 16-bit output numbers are then used to calculate the following two equations.

$$\log_{16} S_0 = (257 \times \log_8 A_0 + \log_{16} C_0) \bmod (2^{16}-1) \qquad (3)$$

$$\log_{16} S_1 = (257 \times \log_8 A_1 + \log_{16} C_1) \bmod (2^{16}-1) \qquad (4)$$

The output values generated by calculating the results of equations (3) and (4) correspond to the error location values, which equal $\log_{16} S_1 - \log_{16} S_0$.

The above described embodiment requires two log tables, a first 8-bit log table and a second 16-bit log table. The 8-bit log table is 8-by-255 bits, having a total of 2040 bits. An example of this table in decimal is shown in FIG. 4A. The 16-bit log table is 16-by-255 bits, having a total of 4080 bits. An example of this table in decimal is shown in FIG. 4B. The two tables together store a total of 6120 bits. The present invention represents an improvement in storage space requirements by a factor of 171 over prior art techniques that require over one million bits of storage space to perform the same calculations.

As mentioned above, the present invention involves extending a finite field of 8-bit symbols $GF(2^8)$ to the finite field $GF(2^{16})$ of 16-bit symbols, such that each 16-bit symbol is viewed as a "complex" number with $GF(2^8)$ components.

According to the present invention, Galois field arithmetic is performed using tower arithmetic. The tower arithmetic involves generating Galois field extensions using irreducible quadratic polynomials. An irreducible polynomial is a Galois field polynomial that does not factor in the ground field. In other words, the polynomial's roots are not in the ground field.

The base field $GF(2)$ is first extended to $GF(2^8)$ using an irreducible primitive polynomial. $GF(2^8)$ is extended to a quadratic extension $GF(2^{16})$ using an irreducible polynomial. The extensions are represented as $GF(2)$–$GF(2^8)$–$GF(2^{16})$.

According to the present invention, all of the polynomials used to generate the quadratic extensions of the Galois field are in the form, $x^2+x+K$, where K is an element in the ground field whose absolute trace equals 1. Given a ground field, the absolute trace of all its elements can be calculated over $GF(2)$. The values can be 0 or 1. Any element K whose absolute trace=1 can be used in $x^2+x+K$.

The Galois field $GF(2^m)$ is a set that contains a finite number of elements, where m is a positive integer. A finite extension $F=\mathbb{F}_{q^m}$ of the finite field $K=\mathbb{F}_q$ is a vector space over K. F has dimension m over K, and $\{\alpha_1, \ldots, \alpha_m\}$ is a basis of F over K. For $\alpha \in F=\mathbb{F}_{q^m}$ and $F=\mathbb{F}_q$, the trace of $\text{Tr}_{F/K}(\alpha)$ over K is defined by equation (5).

$$\text{Tr}_{F/K}(\alpha) = \alpha + \alpha^q + \ldots + \alpha^{q^{m-1}} \qquad (5)$$

If K is the prime subfield of F, then $\text{Tr}_{F/K}(\alpha)$ is called the absolute trace of $\alpha$ and simply denoted by $\text{Tr}_F(\alpha)$. In other words, the trace of $\alpha$ over K is the sum of the conjugates of $\alpha$ with respect to K.

According to the present invention, there are 16 irreducible primitive polynomials that generate $GF(2^8)$ from $GF(2)$. The 16 polynomials are shown in Table 1.

TABLE 1

| |
|---|
| $x^8 + x^4 + x^3 + x^2 + 1$ |
| $x^8 + x^5 + x^3 + x + 1$ |
| $x^8 + x^5 + x^3 + x^2 + 1$ |
| $x^8 + x^6 + x^3 + x^2 + 1$ |
| $x^8 + x^6 + x^5 + x + 1$ |
| $x^8 + x^6 + x^5 + x^2 + 1$ |
| $x^8 + x^6 + x^5 + x^3 + 1$ |

TABLE 1-continued $x^8 + x^6 + x^5 + x^4 + 1$
$x^8 + x^7 + x^2 + x + 1$
$x^8 + x^7 + x^3 + x^2 + 1$
$x^8 + x^7 + x^5 + x^3 + 1$
$x^8 + x^7 + x^6 + x + 1$
$x^8 + x^6 + x^4 + x^3 + x^2 + x + 1$
$x^8 + x^7 + x^6 + x^3 + x^2 + x + 1$
$x^8 + x^7 + x^6 + x^5 + x^2 + x + 1$
$x^8 + x^7 + x^6 + x^5 + x^4 + x^2 + 1$ The Galois field $GF(2^8)$ can be generated from $GF(2)$ using a generator "a" that is a root of $a^8+a^4+a^3+a^2+1=0$. The quadratic extension $GF(2^{16})$ is calculated as follows. There are 128 $GF(2^{16})$ generators over $GF(2^8)$ that correspond to all of the polynomials $b^2+b+a^i$, where $trace(a^i)=1$. The values that correspond to $trace(a^i)=1$ are provided in the following list for $trace(a^i)$, where i=[5, 9, 10, 11, 15, 18, 20, 21, 22, 29, 30, 33, 36, 39, 40, 42, 43, 44, 47, 53, 55, 57, 58, 60, 61, 63, 65, 66, 69, 71, 72, 77, 78, 79, 80, 81, 83, 84, 86, 87, 88, 89, 91, 93, 94, 95, 97, 101, 106, 107, 109, 110, 114, 115, 116, 117, 120, 121, 122, 125, 126, 130, 132, 133, 135, 138, 142, 144, 147, 149, 151, 154, 155, 156, 158, 159, 160, 162, 163, 166, 167, 168, 169, 171, 172, 173, 174, 175, 176, 178, 181, 182, 185, 186, 188, 190, 194, 195, 201, 202, 203, 205, 207, 209, 211, 212, 213, 214, 215, 218, 220, 225, 228, 229, 230, 231, 232, 233, 234, 235, 240, 242, 243, 244, 245, 249, 250, 252]. Each of the nonzero values in this list corresponds to a power $a^i$ to generate a list of 128 irreducible quadratic polynomials defined in $GF(2^8)$ of the form $b^2+b+a^i$.

The Galois field $GF(2^8)$ can be also generated from $GF(2)$ using a generator "a" that is a root of $a^8+a^5+a^3+a+1=0$. The quadratic extension $GF(2^{16})$ is calculated as follows. There are 128 $GF(2^{16})$ generators over $GF(2^8)$ that correspond to all of the polynomials $b^2+b+a^i$, where $trace(a^i)=1$. The values that correspond to $trace(a^i)=1$ are provided in the following list for $trace(a^i)$, where i=[3, 5, 6, 7, 9, 10, 12, 13, 14, 15, 18, 20, 21, 23, 24, 26, 28, 29, 30, 33, 36, 39, 40, 42, 46, 47, 48, 52, 55, 56, 57, 58, 60, 65, 66, 67, 69, 71, 72, 78, 80, 81, 84, 91, 92, 94, 95, 96, 104, 107, 109, 110, 111, 112, 113, 114,115, 116, 120, 121, 123, 125, 127, 129, 130, 131, 132, 134, 135, 138, 139,142, 144, 147, 151, 155, 156, 160, 161, 162, 163, 168, 173, 175, 181, 182, 183, 184, 185, 188, 189, 190, 191, 192, 193, 195, 197, 201, 203, 205, 208,209, 214, 215, 218,219, 220, 222, 223, 224, 225, 226, 228, 229, 230, 232, 235, 237, 239, 240, 242, 245, 246, 247, 250, 251, 253, 254]. Each of the nonzero values in this list corresponds to a power $a^i$ to generate a list of 128 irreducible quadratic polynomials defined in $GF(2^8)$ of the form $b^2+b+a^i$.

The Galois field $GF(2^8)$ can be also generated from $GF(2)$ using a generator "a" that is a root of $a^8+a^5+a^3+a^2+1=0$. The quadratic extension $GF(2^{16})$ is calculated as follows. There are 128 $GF(2^{16})$ generators over $GF(2^8)$ that correspond to all of the polynomials $b^2+b+a^i$, where $trace(a^i)=1$. The values that correspond to $trace(a^i)=1$ are provided in the following list for $trace(a^i)$, where i=[3, 5, 6, 10, 11, 12, 19, 20, 22, 23, 24, 25, 27, 35, 38, 40, 43, 44, 45, 46, 47, 48, 49, 50, 54, 55, 59, 61, 63, 65, 70, 75, 76, 79, 80, 86, 87, 88, 89, 90, 92, 93, 94, 96, 97, 98, 99, 100, 101, 103, 105, 108, 110, 111, 113, 115, 117, 118, 121, 122, 123, 126, 129,130, 133, 137, 139, 140, 141, 145, 149, 150, 151, 152, 155, 157, 158, 159, 160, 165, 167, 171, 172, 174, 176, 177, 178, 179, 180, 183, 184, 185, 186, 188, 189, 192, 194, 196, 197, 198, 200, 202, 203, 205, 206, 207, 210, 211, 213, 216, 217, 219, 220, 222, 226, 229, 230, 231, 233, 234, 236, 237, 242, 243, 244, 246, 249, 252]. Each of the nonzero values in this list corresponds to a power $a^i$ to generate a list of 128 irreducible quadratic polynomials defined in $GF(2^8)$ of the form $b^2+b+a^i$.

The Galois field $GF(2^8)$ can be also generated from $GF(2)$ using a generator "a" that is a root of $a^8+a^6+a^3+a^2+1=0$. The quadratic extension $GF(2^{16})$ is calculated as follows. There are 128 $GF(2^{16})$ generators over $GF(2^8)$ that correspond to all of the polynomials $b^2+b+a^i$, where $trace(a^i)=1$. The values that correspond to $trace(a^i)=1$ are provided in the following list for $trace(a^i)$, where i=[5, 7, 9, 10, 14, 15, 18, 19, 20, 27, 28, 29, 30, 31, 33, 36, 38, 40, 43, 49, 54, 55, 56, 58, 59, 60, 61, 62, 63, 65, 66, 71, 72, 76, 79, 80, 86, 87, 89, 93, 95, 98, 99, 101, 103, 108, 110, 111, 112, 115, 116, 117, 118, 120, 122, 123, 124, 125, 126, 130, 131, 132, 135, 137, 141, 142, 143, 144, 149, 152, 155, 157, 158, 159, 160, 163, 167, 171, 172, 174, 175, 177, 178, 179, 183, 185, 186, 189, 190, 193, 195, 196, 198, 199, 202, 205, 206, 207, 209, 211, 213, 215, 216, 217, 219, 220, 222, 224, 225, 227, 230, 231, 232, 233, 234, 235, 236, 237, 240, 241, 243, 244, 245, 246, 248, 249, 250, 252]. Each of the nonzero values in this list corresponds to a power $a^i$ to generate a list of 128 irreducible quadratic polynomials defined in $GF(2^8)$ of the form $b^2+b+a^i$.

The Galois field $GF(2^8)$ can be also generated from $GF(2)$ using a generator "a" that is a root of $a^8+a^6+a^5+a+1=0$. The quadratic extension $GF(2^{16})$ is calculated as follows. There are 128 $GF(2^{16})$ generators over $GF(2^8)$ that correspond to all of the polynomials $b^2+b+a^i$, where $trace(a^i)=1$. The values that correspond to $trace(a^i)=1$ are provided in the following list for $trace(a^i)$, where i=[3, 5, 6, 9, 10, 12, 13, 18, 19, 20, 21, 24, 25, 26, 31, 33, 35, 36, 37, 38, 39, 40, 41, 42, 45, 47, 48, 49, 50, 52, 55, 57, 62, 63, 65, 66, 67, 69, 70, 72, 73, 74, 75, 76, 78, 80, 81, 82, 84, 90, 91, 94, 96, 98, 100, 104, 105, 107, 109, 110, 114, 115, 121, 124, 126, 127, 129, 130, 132, 134, 137, 138, 140, 143, 144, 145, 146, 147, 148, 150, 151, 152, 155, 156, 159, 160, 161, 162, 164, 165, 168, 173, 180, 181, 182, 185, 188, 191, 192, 196, 199, 200, 201, 203, 205, 207, 208, 210, 214, 218, 220, 223, 227, 228, 229, 230, 231, 239, 241, 242, 243, 247, 248, 249, 251, 252, 253, 254]. Each of the nonzero values in this list corresponds to a power $a^i$ to generate a list of 128 irreducible quadratic polynomials defined in $GF(2^8)$ of the form $b^2+b+a^i$.

The Galois field $GF(2^8)$ can be also generated from $GF(2)$ using a generator "a" that is a root of $a^8+a^6+a^5+a^2+1=0$. The quadratic extension $GF(2^{16})$ is calculated as follows. There are 128 $GF(2^{16})$ generators over $GF(2^8)$ that correspond to all of the polynomials $b^2+b+a^i$, where $trace(a^i)=1$. The values that correspond to $trace(a^i)=1$ are provided in the following list for $trace(a^i)$, where i=[3, 5, 6, 7, 9, 10, 11, 12, 14, 15, 18, 19, 20, 21, 22, 23, 24, 25, 28, 30, 31, 33, 35, 36, 38, 39, 40, 42, 44, 46, 48, 49, 50, 53, 56, 57, 59, 60, 62, 65, 66, 69, 70, 72, 76, 77, 78, 80, 81, 83, 84, 88, 92, 95, 96, 97, 98, 100, 103, 106, 111, 112, 113, 114, 118, 120, 123, 124, 125, 129, 130, 131, 132, 133, 135, 137, 138, 139, 140, 143, 144, 145, 147, 152, 154, 156, 157, 160, 162, 166, 168, 169, 175, 176, 179, 183, 184, 189, 190, 192, 193, 194, 195, 196, 197, 199, 200, 201, 206, 212, 215, 217, 219, 222, 224, 225, 226, 227, 228, 235, 236, 237, 240, 241, 245, 246, 248, 250]. Each of the nonzero values in this list corresponds to a power $a^i$ to generate a list of 128 irreducible quadratic polynomials defined in $GF(2^8)$ of the form $b^2+b+a^i$.

The Galois field $GF(2^8)$ can be also generated from $GF(2)$ using a generator "a" that is a root of $a^8+a^6+a^5+a^3+1=0$. The quadratic extension $GF(2^{16})$ is calculated as follows. There are 128 $GF(2^{16})$ generators over $GF(2^8)$ that correspond to all of the polynomials $b^2+b+a^i$, where $trace(a^i)=1$. The values that correspond to $trace(a^i)=1$ are provided in the following list for $trace(a^i)$, where i=[3, 6, 9, 11, 12, 13, 18, 19, 21, 22, 24, 25, 26, 29, 33, 35, 36, 38, 39, 42, 44, 45, 48, 49, 50, 52, 53, 55, 57, 58, 59, 61, 63, 66, 67, 69, 70, 71, 72, 75, 76, 77, 78, 79, 81, 83, 84, 88, 90, 95, 96, 97, 98, 100, 103, 104, 105, 106, 110, 114, 115, 116, 118, 122, 125, 126, 129, 132, 133, 134, 137, 138, 140, 142, 144, 145, 147, 150, 152, 154, 155, 156, 157, 158, 159, 161, 162, 163, 165, 166, 167, 168, 169, 175, 176, 179, 180, 185, 190, 192, 194, 196, 200, 201, 205, 206, 207, 208, 209, 210, 211, 212, 215, 217, 220, 228, 230, 231, 232, 233, 235, 236, 243, 244, 245, 249, 250, 252]. Each of the nonzero values in this list corresponds to a power $a^i$ to generate a list of 128 irreducible quadratic polynomials defined in $GF(2^8)$ of the form $b^2+b+a^i$.

The Galois field $GF(2^8)$ can be also generated from $GF(2)$ using a generator "a" that is a root of $a^8+a^6+a^5+a^4+1=0$. The quadratic extension $GF(2^{16})$ is calculated as follows. There are 128 $GF(2^{16})$ generators over $GF(2^8)$ that correspond to all of the polynomials $b^2+b+a^i$, where trace($a^i$)=1. The values that correspond to trace($a^i$)=1 are provided in the following list for trace($a^i$), where i=[3, 5, 6, 10, 11, 12, 13, 15, 20, 21, 22, 23, 24, 25, 26, 27, 30, 35, 37, 40, 41, 42, 43, 44, 46, 48, 50, 52, 53, 54, 60, 61, 65, 67, 69, 70, 73, 74, 77, 79, 80, 81, 82, 83, 84, 86, 87, 88, 89, 92, 93, 95, 96, 97, 99, 100, 101, 104, 106, 108, 111, 113, 117, 120, 122, 123, 125, 129, 130, 133, 134, 135, 138, 139, 140, 141, 145, 146, 148, 149, 154, 158, 160, 161, 162, 164, 166, 167, 168, 169, 171, 172, 174, 175, 176, 177, 178, 183, 184, 186, 189, 190, 192, 194, 195, 197, 198, 200, 202, 208, 211, 212, 213, 215, 216, 219, 222, 225, 226, 233, 234, 235, 237, 240, 244, 245, 246, 250]. Each of the nonzero values in this list corresponds to a power $a^i$ to generate a list of 128 irreducible quadratic polynomials defined in $GF(2^8)$ of the form $b^2+b+a^i$.

The Galois field $GF(2^8)$ can be also generated from $GF(2)$ using a generator "a" that is a root of $a^8+a^7+a^2+a+1=0$. The quadratic extension $GF(2^{16})$ is calculated as follows. There are 128 $GF(2^{16})$ generators over $GF(2^8)$ that correspond to all of the polynomials $b^2+b+a^i$, where trace($a^i$)=1. The values that correspond to trace($a^i$)=1 are provided in the following list for trace($a^i$), where i=[1, 2, 3, 4, 5, 6, 7, 8, 10, 12, 14, 15, 16, 19, 20, 21, 24, 27, 28, 30, 32, 37, 38, 40, 41, 42, 48, 49, 54, 55, 56, 60, 61, 64, 65, 69, 73, 74, 76, 79, 80, 81, 82, 84, 87, 91, 93, 95, 96, 98, 99, 107, 108, 109, 110, 111, 112, 115, 117, 120, 122, 123, 125, 127, 128, 129, 130, 131, 135, 137, 138, 141, 146, 148, 152, 155, 158, 160, 162, 164, 167, 168, 171, 173, 174, 175, 177, 181, 182, 183, 185, 186, 189, 190, 191, 192, 193, 195, 196, 198, 205, 211, 213, 214, 215, 216, 218, 219, 220, 222, 223, 224, 225, 230, 233, 234, 235, 237, 239, 240, 244, 245, 246, 247, 250, 251, 253, 254]. Each of the nonzero values in this list corresponds to a power $a^i$ to generate a list of 128 irreducible quadratic polynomials defined in $GF(2^8)$ of the form $b^2+b+a^i$.

The Galois field $GF(2^8)$ can be also generated from $GF(2)$ using a generator "a" that is a root of $a^8+a^7+a^3+a^2+1=0$. The quadratic extension $GF(2^{16})$ is calculated as follows. There are 128 $GF(2^{16})$ generators over $GF(2^8)$ that correspond to all of the polynomials $b^2+b+a^i$, where trace($a^i$)=1. The values that correspond to trace($a^i$)=1 are provided in the following list for trace($a^i$), where i=[1, 2, 3, 4, 6, 7, 8, 12, 13, 14, 16, 24, 25, 26, 27, 28, 32, 35, 37, 41, 45, 47, 48, 50, 52, 54, 55, 56, 59, 63, 64, 67, 70, 73, 74, 75, 82, 87, 90, 91, 93, 94, 95, 96, 99, 100, 103, 104, 105, 107, 108, 109, 110, 111, 112, 115, 117, 118, 121, 123, 125, 126, 128, 129, 131, 134, 140, 141, 145, 146, 148, 150, 151, 155, 157, 159, 161, 164, 165, 171, 173, 174, 175, 177, 179, 180, 181, 182, 183, 185, 186, 188, 189, 190, 192, 193, 198, 200, 203, 205, 206, 207, 208, 210, 213, 214, 215, 216, 217, 218, 219, 220, 222, 224, 229, 230, 231, 234, 235, 236, 237, 242, 243, 245, 246, 249, 250, 252]. Each of the nonzero values in this list corresponds to a power $a^i$ to generate a list of 128 irreducible quadratic polynomials defined in $GF(2^8)$ of the form $b^2+b+a^i$.

The Galois field $GF(2^8)$ can be also generated from $GF(2)$ using a generator "a" that is a root of $a^8+a^7+a^5+a^3+1=0$. The quadratic extension $GF(2^{16})$ is calculated as follows. There are 128 $GF(2^{16})$ generators over $GF(2^8)$ that correspond to all of the polynomials $b^2+b+a^i$, where trace($a^i$)=1. The values that correspond to trace($a^i$)=1 are provided in the following list for trace($a^i$), where i=[1, 2, 4, 5, 8, 9, 10, 13, 15, 16, 18, 20, 23, 25, 26, 27, 29, 30, 31, 32, 33, 35, 36, 37, 40, 41, 46, 47, 50, 52, 54, 58, 60, 62, 63, 64, 65, 66, 67, 70, 71, 72, 73, 74, 80, 82, 87, 92, 93, 94, 95, 99, 100, 104, 108, 111, 113, 116, 117, 120, 121, 123, 124, 125, 126, 128, 130, 132, 134, 135, 139, 140, 141, 142, 143, 144, 145, 146, 148, 151, 159, 160, 161, 163, 164, 171, 174, 175, 177, 183, 184, 186, 188, 189, 190, 195, 197, 198, 199, 200, 203, 207, 208, 209, 213, 215, 216, 219, 222, 225, 226, 227, 229, 231, 232, 234, 235, 237, 240, 241, 242, 243, 245, 246, 248, 249, 250, 252]. Each of the nonzero values in this list corresponds to a power $a^i$ to generate a list of 128 irreducible quadratic polynomials defined in $GF(2^8)$ of the form $b^2+b+a^i$.

The Galois field $GF(2^8)$ can be also generated from $GF(2)$ using a generator "a" that is a root of $a^8+a^7+a^6+a+1=0$. The quadratic extension $GF(2^{16})$ is calculated as follows. There are 128 $GF(2^{16})$ generators over $GF(2^8)$ that correspond to all of the polynomials $b^2+b+a^i$, where trace($a^i$)=1. The values that correspond to trace($a^i$)=1 are provided in the following list for trace($a^i$), where i=[1, 2, 4, 5, 8, 9, 10, 11, 15, 16, 18, 20, 21, 22, 25, 30, 31, 32, 33, 35, 36, 37, 39, 40, 41, 42, 44, 50, 57, 59, 60, 62, 63, 64, 65, 66, 69, 70, 72, 73, 74, 78, 80, 81, 82, 84, 87, 88, 91, 93, 95, 97, 100, 103, 107, 109, 114, 117, 118, 120, 124, 125, 126, 127, 128, 130, 132, 133, 135, 138, 140, 143, 144, 145, 146, 147, 148, 156, 157, 159, 160, 162, 164, 168, 171, 173, 174, 175, 176, 179, 181, 182, 186, 190, 191, 194, 195, 199, 200, 201, 206, 207, 213, 214, 215, 217, 218, 223, 225, 227, 228, 231, 234, 235, 236, 239, 240, 241, 243, 245, 247, 248, 249, 250, 251, 252, 253, 254]. Each of the nonzero values in this list corresponds to a power $a^i$ to generate a list of 128 irreducible quadratic polynomials defined in $GF(2^8)$ of the form $b^2+b+a^i$.

The Galois field $GF(2^8)$ can be also generated from $GF(2)$ using a generator "a" that is a root of $a^8+a^6+a^4+a^3+a^2+a+1=0$. The quadratic extension $GF(2^{16})$ is calculated as follows. There are 128 $GF(2^{16})$ generators over $GF(2^8)$ that correspond to all of the polynomials $b^2+b+a^i$, where trace($a^i$)=1. The values that correspond to trace($a^i$)=1 are provided in the following list for trace($a^i$), where i=[5, 9, 10, 18, 20, 23, 25, 27, 29, 33, 35, 36, 37, 39, 40, 41, 43, 45, 46, 47, 50, 53, 54, 55, 57, 58, 63, 65, 66, 70, 71, 72, 73, 74, 75, 77, 78, 80, 82, 83, 86, 87, 89, 90, 92, 93, 94, 99, 100, 101, 105, 106, 108, 110, 113, 114, 115, 116, 117, 121, 126, 127, 130, 132, 139, 140, 141, 142, 144, 145, 146, 147, 148, 149, 150, 151, 154, 155, 156, 159, 160, 163, 164, 165, 166, 169, 171, 172, 174, 177, 178, 180, 184, 185, 186, 188, 191, 197, 198, 200, 201, 202, 203, 205, 207, 209, 210, 212, 213, 216, 220, 223, 226, 228, 229, 230, 231, 232, 234, 239, 242, 243, 247, 249, 251, 252, 253, 254]. Each of the nonzero values in this list corresponds to a power $a^i$ to generate a list of 128 irreducible quadratic polynomials defined in $GF(2^8)$ of the form $b^2+b+a^i$.

The Galois field $GF(2^8)$ can be also generated from $GF(2)$ using a generator "a" that is a root of $a^8+a^7+a^6+a^3+a^2+a+1=0$. The quadratic extension $GF(2^{16})$ is calculated as follows. There are 128 $GF(2^{16})$ generators over $GF(2^8)$ that correspond to all of the polynomials $b^2+b+a^i$, where trace($a^i$)=1. The values that correspond to trace($a^i$)=1 are provided in the following list for trace($a^i$), where i=[1, 2, 4, 7, 8, 9, 14, 16, 18, 25, 27, 28, 31, 32, 33, 35, 36, 39, 45, 50, 53, 54, 55, 56, 57, 59, 61, 62, 63, 64, 66, 70, 72, 75, 77, 78, 79, 83, 87, 90, 93, 95, 99, 100, 103, 105, 106, 108, 110, 112, 114, 115, 117, 118, 122, 124, 125, 126, 127, 128, 131, 132, 140, 141, 143, 144, 145, 147, 150, 154, 155, 156, 157, 158, 159, 165, 166, 167, 169, 171, 174, 175, 177, 179, 180, 185, 186, 190, 191, 193, 198, 199, 200, 201, 205, 206, 207, 210, 211, 212, 213, 215, 216, 217, 220, 223, 224, 227, 228, 230, 231, 233, 234, 235, 236, 239, 241, 243, 244, 245, 247, 248, 249, 250, 251, 252, 253, 254]. Each of the nonzero values in this list corresponds to a power $a^i$ to generate a list of 128 irreducible quadratic polynomials defined in $GF(2^8)$ of the form $b^2+b+a^i$.

The Galois field $GF(2^8)$ can be also generated from $GF(2)$ using a generator "a" that is a root of $a^8+a^7+a^6+a^5+a^2+a+1=0$. The quadratic extension $GF(2^{16})$ is calculated as follows. There are 128 $GF(2^{16})$ generators over $GF(2^8)$ that correspond to all of the polynomials $b^2+b+a^i$, where trace($a^i$)=1. The values that correspond to trace($a^i$)=1 are provided in the following list for trace($a^i$), where i=[1, 2, 3, 4, 5, 6, 7, 8, 10, 11, 12, 14, 16, 19, 20, 21, 22, 24, 25, 27, 28, 31, 32, 35, 38, 39, 40, 42, 43, 44, 45, 48, 49, 50, 54, 55, 56, 57, 62, 64, 65, 69, 70, 75, 76, 78, 80, 81, 84, 86, 88, 89, 90, 96, 97, 98, 99, 100, 101, 105, 108, 110, 111, 112, 114, 115, 123, 124, 127, 128, 129, 130, 131, 133, 137, 138, 140, 141, 143, 145, 147, 149, 150, 152, 155, 156, 160, 162, 165, 168, 172, 176, 177, 178, 180, 183, 185, 189, 191, 192, 193, 194, 196, 198, 199, 200, 201, 202, 205, 210, 216, 219, 220, 222, 223, 224, 227, 228, 230, 237, 239, 241, 246, 247, 248, 251, 253, 254]. Each of the nonzero values in this list corresponds to a power $a^i$ to generate a list of 128 irreducible quadratic polynomials defined in $GF(2^8)$ of the form $b^2+b+a^i$.

The Galois field $GF(2^8)$ can be also generated from $GF(2)$ using a generator "a" that is a root of $a^8+a^7+a^6+a^5+a^4+a^2+1=0$. The quadratic extension $GF(2^{16})$ is calculated as follows. There are 128 $GF(2^{16})$ generators over $GF(2^8)$ that correspond to all of the polynomials $b^2+b+a^i$, where trace($a^i$) =1. The values that correspond to trace($a^i$)=1 are provided in the following list for trace($a^i$), where i=[1, 2, 3, 4, 6, 8, 12, 13, 16, 21, 23, 24, 25, 26, 27, 29, 32, 35, 39, 42, 43, 45, 46, 48, 50, 52, 53, 54, 55, 57, 58, 64, 67, 69, 70, 71, 75, 77, 78, 81, 83, 84, 86, 89, 90, 91, 92, 95, 96, 99, 100, 101, 104, 105, 106, 107, 108, 109, 110, 111, 113, 114, 115, 116, 123, 125, 128, 129, 134, 138, 139, 140, 141, 142, 145, 147, 149, 150, 154, 155, 156, 161, 162, 163, 165, 166, 168, 169, 172, 173, 175, 177, 178, 180, 181, 182, 183, 184, 185, 189, 190, 192, 197, 198, 200, 201, 202, 205, 208, 209, 210, 212, 214, 215, 216, 218, 219, 220, 222, 226, 228, 230, 232, 235, 237, 245, 246, 250]. Each of the nonzero values in this list corresponds to a power $a^i$ to generate a list of 128 irreducible quadratic polynomials defined in $GF(2^8)$ of the form $b^2+b+a^i$.

The 8-bit and 16-bit log tables described above can be, for example, implemented in software such as Verilog Hardware Description language (VHDL) or in hardware. These tables are accessed by several independent hardware engines. However, only a single access port is provided to each fixed value hardware lookup table. Therefore, only a single device can access each table at a time. For each log table, an access control device is implemented to govern access by multiple devices to a single resource.

The hardware engines that require access to the log tables consist of four data transfer units and a single processor. Each data transfer unit requires two separate and independent access ports into each table. The first port is used for the calculation of the error location. The second port is used for the calculation of the redundant error location (for uncorrectable error detection). The error location and redundant error location calculation routines are implemented such that they operate concurrently. This is the reason for the requirement for two ports into each lookup table. The processor only requires a single port. In total, each table provides support for nine independent access ports, including 8 ports used by the data transfer units, and one port used by the processor.

Figure 5:
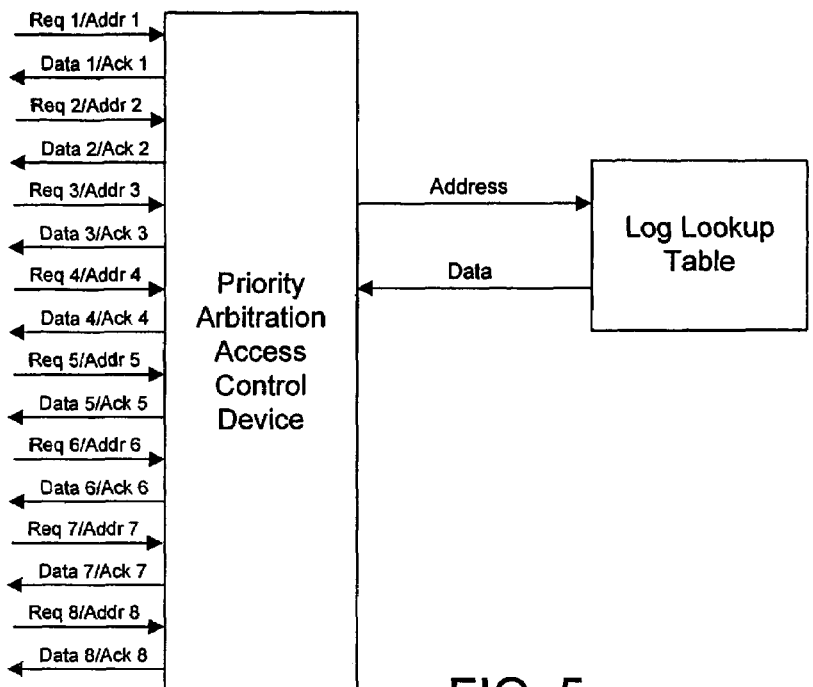
FIG. 5 illustrates an example of an access control device that governs access to each log table according to an embodiment of the present invention.

Because only a single device can access a single table at a time, a delay element is introduced into the access behavior. If multiple devices attempt to access a log table simultaneously, only one device is granted immediate access. The remaining devices incur a delay. The amount of delay observed is measured in clock cycles and can vary based on several factors. FIG. 5 illustrates an example of an access control device that governs access to each log table. Because of the variable delay nature of the access control device, the following interface is a preferred interface type.

For each table, every port is provided the interface shown in FIG. 5. All 8 ports used by the data transfer units have a Reg instruction for requesting access to the lookup table, an Addr instruction indicating the address to be used to access the table when the request is serviced, a Data instruction indicating the data value returned from the table based on the address provided, and an Ack instruction indicating access to the lookup table has completed.

Arbitration is required to properly select a single device when multiple devices are requesting. A drawback to using standard priority arbitration schemes is that the possibility exists for lower priority devices to be completely blocked by frequently requesting higher priority devices. The situation of permanent device blocking cannot occur in the log table environment of the present invention. Therefore, an alternative scheme for use in accordance with the present invention that provides a smaller worst case delay for critical devices and a larger worst case delay for less important devices will now be described.

Arbitration and table accesses are performed in two separate clock cycles in order to achieve a robust design in hardware, while still providing a sufficient level of performance. Arbitration occurs in the first clock cycle. Table access, using the address from the arbitration winner, occurs in the second clock cycle. Because these two operations can be implemented as independent functions, they can be allowed to overlap each other in time.

Therefore, during the same clock cycle, a table access is performed for the current access. The arbitration for the next access can also be performed at the same time. This technique results in the ability to perform a table access every clock cycle during instances of multiple requests.

For each device that requires access to a table, the best case access time occurs when that device is the highest priority device requesting (winning arbitration immediately). The best case access time also includes the situation when that device is the only device requesting. The best case value is two clock cycles, one cycle for arbitration, and one cycle for access.

For each device that requires access to a table, the worst case access time is dependent on what priority the device is assigned as well as the access frequency of all higher priority devices. For the highest priority device (Port 1), the worst case access time is the same as the best case access time, because it will always win arbitration immediately.

For the second place priority device (Port 2), the worst case access time is dependent on the behavior of Port 1. If Port 1 never makes consecutive accesses, the worst case access time for Port 2 occurs when Port 1 attempts a request at the same time. Port 2 must wait for Port 1 to finish a single access. In this situation, the worst case access time for Port 2 is three clock cycles, including one arbitration cycle lost, one arbitration cycle won and one for access. The worst case access time for all lower priority devices is also dependent on higher priority device behavior. However, more information is required on the expected system behavior.

For the data transfer units, table accesses are required only when calculating error locations. Table accesses only occur once an entire sector has been processed and syndromes have been generated. This occurs after the sector has been completely loaded from DRAM. Because only one data transfer unit can access the DRAM at a time, only one data transfer unit begins to access the tables at a single point in time. The earliest that another data transfer unit can also begin its table access sequence is 7 clock cycles later. The earliest that a single data transfer unit can begin a second table access sequence for a second sector is 39 clock cycles later.

The worst case situation for a single data transfer unit involves 4 accesses to the 8-bit log table and 2 accesses to the 16-bit log table per request port. It is preferable that the table accesses along with all associated calculations be completed before the data transfer unit begins calculations for the next sector. This obviates the need for duplicating calculation logic for each data transfer unit and minimizes the hardware implementation. As an example, 39 clock cycles are provided to complete all of the table accesses.

Based on the calculation state machine, table accesses for a port are alternated with a single clock cycle of calculations. When a data transfer unit begins a calculation sequence, both requests into the 8-bit log table are activated simultaneously. The error location port is given a higher priority than the redundant error location port. The net result is an alternating access to the 8-bit log table between the two ports. Similar access behavior exists for the 16-bit log table. The best case calculation sequence for a data transfer unit is 15 clock cycles (requiring 8 accesses for the 8-bit log table and 4 accesses for the 16-bit log table).

Figure 6:
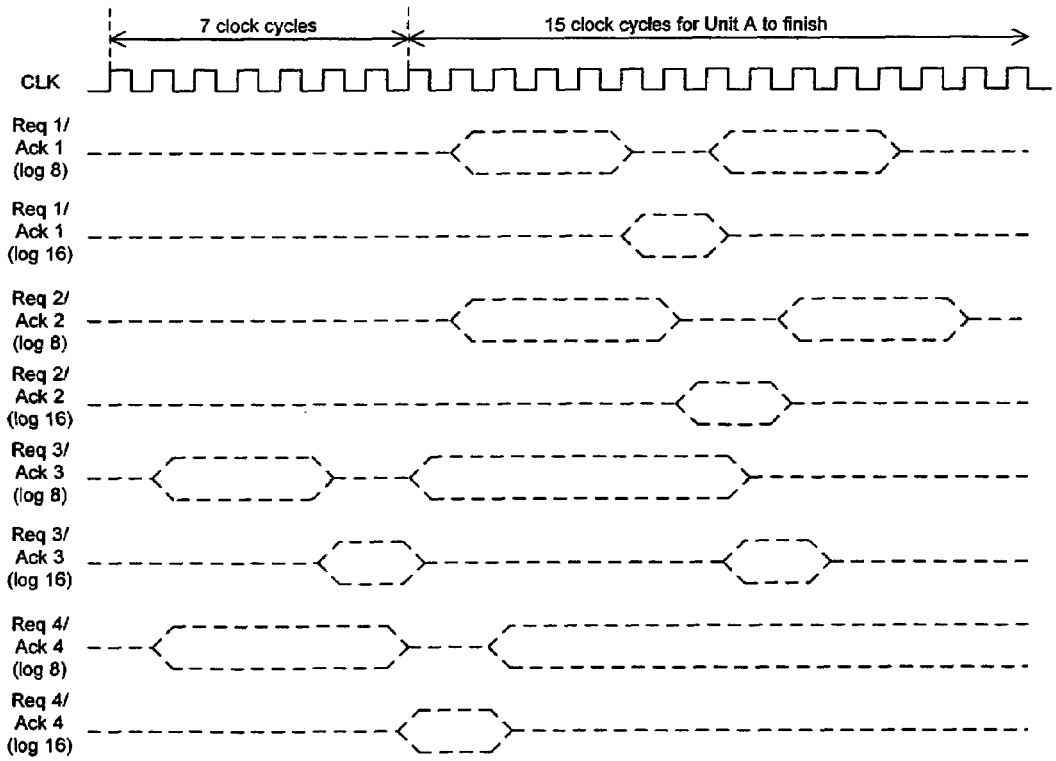
FIG. 6 shows timing diagrams that illustrate the worst case calculation times for 8 ports corresponding to 4 data transfer units according to an embodiment of the present invention.

A second data transfer unit may begin a calculation sequence as early as 7 cycles after a first data transfer unit begins its calculation sequence. If the second data transfer unit is assigned a higher priority into the two log tables, it causes the first data transfer unit's calculation routines to stall, thus increasing calculation time. The amount of time by which the calculation routine is stalled equals 8 clock cycles. The timing diagrams shown in FIG. 6 illustrate the worst case calculation times for 8 ports corresponding to 4 data transfer units.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A disk drive controller comprising:
an error correction decoder that generates a first syndrome $S_0$ and a second syndrome $S_1$ and calculates $\log(S_1/S_0)$ to locate an error in a block of data read by the disk drive controller by representing the first and the second syndromes in the form $Az+B$, and by solving a resulting equation, $\log(S_1/S_0)=[\log(A)+\log(z+B/A)]$ rood $(2^{16}-1)$, wherein the error correction decoder is configured to correct data read by the disk drive controller.

2. The disk drive controller defined in claim 1 wherein the error correction decoder solves equation, $S_0=A_0z+B_0=A_0(z+C_0)$, and equation, $S_1=A_1z+B_1=A_1(z+C_1)$, for numbers $[iA_0, iB_0, iA_1, iB_1]$ and uses numbers $[iA_0, iB_0, iA_1, iB_1]$ as inputs to a first log table to generate outputs $[\log_8 A_0, \log_8 B_0, \log_8 A_1, \log_8 B_1]$ from the first log table, wherein the first log table takes as an input a numerical index "i" and produces as an output a vector that is the corresponding logarithm.

3. The disk drive controller defined in claim 2 wherein the error correction decoder calculates $\log_8 C_0 = (\log_8 B_0 - \log_8 A_0)$ mod 255, and $\log_8 C_1 = (\log_8 B_1 - \log_8 A_1)$ mod 255 using outputs $[\log_8 A_0, \log_8 B_0, \log_8 A_1, \log_8 B_1]$ from the first log table.

4. The disk drive controller defined in claim 3 wherein $[\log_8 C_0, \log_8 C_1]$ are used as inputs to the 16-bit log table to obtain two 16-bit output numbers $[\log_{16} C_0, \log_{16} C_1]$.

5. The disk drive controller defined in claim 4 wherein $[\log_{16} C_0, \log_{16} C_1]$ are used to calculate equations:

$$\log_{16} S_0 = (257 \times \log_8 A_0 + \log_{16} C_0) \bmod (2^{16}-1)$$

$$\log_{16} S_1 = (257 \times \log_8 A_1 + \log_{16} C_1) \bmod (2^{16}-1).$$

* * * * *

UNITED STATES PATENT AND TRADEMARK OFFICE
CERTIFICATE OF CORRECTION

| | | |
|---|---|---|
| PATENT NO. | : 7,475,329 B2 | Page 1 of 1 |
| APPLICATION NO. | : 11/059734 | |
| DATED | : January 6, 2009 | |
| INVENTOR(S) | : Hassner et al. | |

It is certified that error appears in the above-identified patent and that said Letters Patent is hereby corrected as shown below:

<u>In the Claims:</u>

Claim 1, Column 14, Line 21 please delete "rood" and insert --mod--.

Signed and Sealed this

Twenty-fourth Day of March, 2009

JOHN DOLL
*Acting Director of the United States Patent and Trademark Office*